(12) United States Patent
Liaw

(10) Patent No.: US 7,485,934 B2
(45) Date of Patent: Feb. 3, 2009

(54) INTEGRATED SEMICONDUCTOR STRUCTURE FOR SRAM CELLS

(75) Inventor: Jhon-Jhy Liaw, Shin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 283 days.

(21) Appl. No.: 11/257,572

(22) Filed: Oct. 25, 2005

(65) Prior Publication Data

US 2007/0090428 A1    Apr. 26, 2007

(51) Int. Cl.
*H01L 29/76* (2006.01)
(52) U.S. Cl. .................. 257/388; 257/412; 257/413; 257/903; 257/E27.098
(58) Field of Classification Search ................ 257/368, 257/388, 412, 413, 903, E27.098
See application file for complete search history.

(56) References Cited

U.S. PATENT DOCUMENTS 6,198,143 B1 * 3/2001 Ohsaki ................... 257/412
6,583,518 B2 * 6/2003 Trivedi et al. ............ 257/357
6,700,163 B2 * 3/2004 Breitwisch et al. ........ 257/369
6,841,429 B2 * 1/2005 Matsuda et al. .......... 438/153
2002/0028569 A1 * 3/2002 Igarashi et al. .......... 438/587

* cited by examiner

*Primary Examiner*—Matthew E Warren
(74) *Attorney, Agent, or Firm*—K & L Gates LLP

(57) ABSTRACT

A semiconductor structure includes a semiconductor substrate having a first device area and a second device area. A gate layer is formed across the first device area and the second device area on the semiconductor substrate, wherein a first portion of the gate layer running across the first device area is doped with impurities of a type different from that of a second portion of the gate layer running across the second device area. A cap layer is formed on the gate layer for protecting the same covered thereunder from forming a silicide structure, having at least one opening at a junction of the first and second portions of the gate layer. A silicide layer is formed on the gate layer that is exposed by the opening for reducing resistance at the junction between the first and second portions.

14 Claims, 5 Drawing Sheets

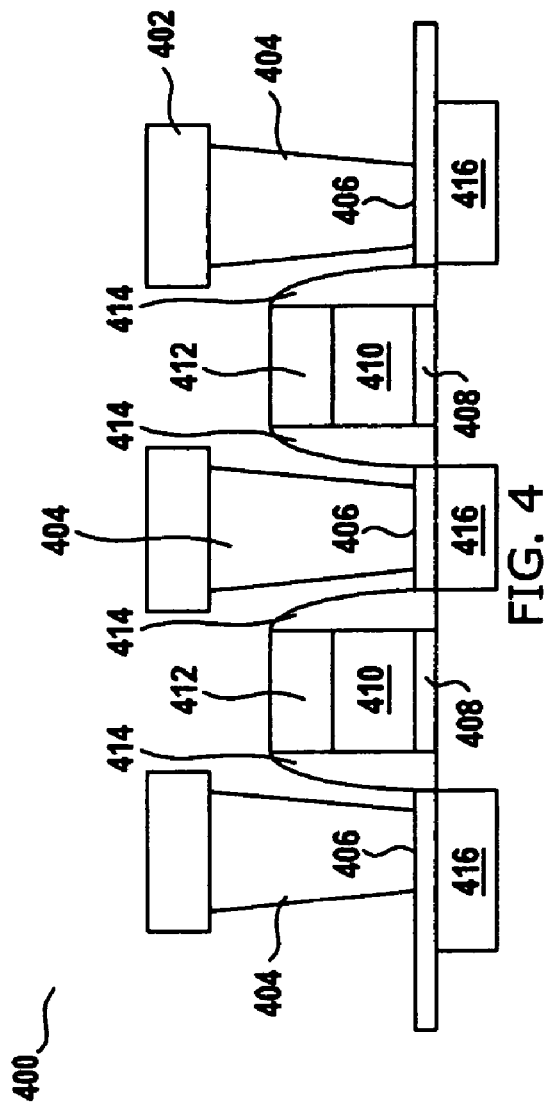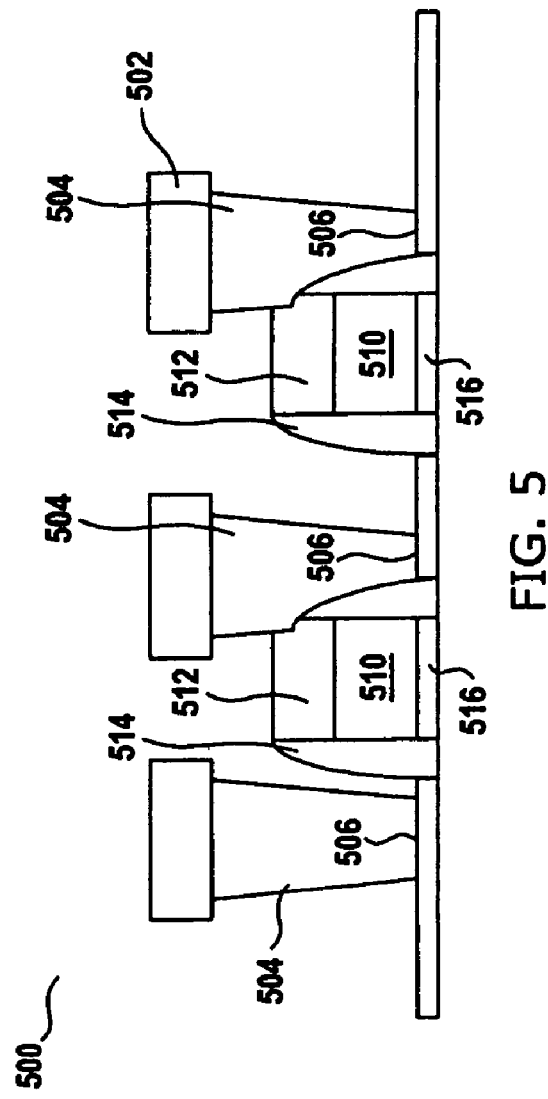

INTEGRATED SEMICONDUCTOR STRUCTURE FOR SRAM CELLS

BACKGROUND

The present invention relates generally to integrated circuit (IC) designs, and more particularly to a semiconductor structure for reducing a gate resistance while providing a self-aligned silicide contact for a static random access memory (SRAM) cell.

As the semiconductor technology advances into the deep sub-micron realm, semiconductor structures become ever more crowded in an IC chip. SRAM cells, for instance, have become so dense that it has become increasingly difficult to form all the necessary electrical wiring in a SRAM chip. The interconnection structure from one metal interconnection wiring level to another, and also into the source/drain, gate, and body of a metal-oxide-semiconductor (MOS) transistor, require vertical conductive vias. In dual damascene metallization, metal, typically copper, is filled into etched vias and trenches, and excess is polished off by a process, such as chemical-mechanical-polish (CMP). Metal-filled vias provide vertical connections and metal-filled trenches provide lateral pads and lines.

Vias are typically the smallest features that must be resolved by lithography and etching. A metal-filled via down from the metal 1 level to contacts on the active semiconductor substrate must be small enough to fit without causing an electrical short to any other substrate site, to a polycrystalline silicon (poly) line or gate, or to another via.

Two structures are often used to facilitate via formation down to a contact. The first is a silicide, a layer formed on top of a poly gate for providing an Ohm contact between the poly gate and via. The second is a self-aligned contact. Here, a cap layer is formed on the top surface of poly gates. In combination with spacers on the sidewalls of the poly gates, the cap layer fully insulates the poly gates on all sides. A metal layer is formed on source/drain regions of a semiconductor substrate. The semiconductor substrate is thermally treated to form silicide layers at the interfaces of the metal layer and the source/drain regions as self-aligned contacts. Due to the cap layer, the poly gate is protected from formation of silicide thereon during the thermal treatment process.

These two structures are rather mutually exclusive. If self-aligned contact is used, then the cap layer atop the poly gate prevents the formation of silicide on the poly gate. As a result, the poly gate is left with a resistance that is too high for proper circuit function.

Therefore, desirable in the art of integrated circuit designs are additional structures and methods for providing self-aligned silicide and self-aligned contacts in a simultaneous and effective fashion.

SUMMARY

The present invention provides a semiconductor structure. In one embodiment, the semiconductor structure includes a semiconductor substrate having a first device area and a second device area. A gate layer is formed across the first device area and the second device area on the semiconductor substrate, wherein a first portion of the gate layer running across the first device area is doped with impurities of a first type, and a second portion of the gate layer running across the second device area is doped with impurities of a second type that is different from the first type. A cap layer is formed on the gate layer for protecting the same covered thereunder from forming a silicide structure, having at least one opening at a junction of the first and second portions of the gate layer. A silicide layer is formed on the gate layer that is exposed by the opening for reducing resistance at the junction between the first and second portions of the gate silicon layer.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4 through 6 are cross-sectional views of the SRAM memory cell shown in FIGS. 2 and 3 in accordance with various embodiments of the present invention.

DESCRIPTION

The following will provide a detailed description of a structure for providing self-aligned silicide and self-aligned contacts in integral processes.

Figure 1:
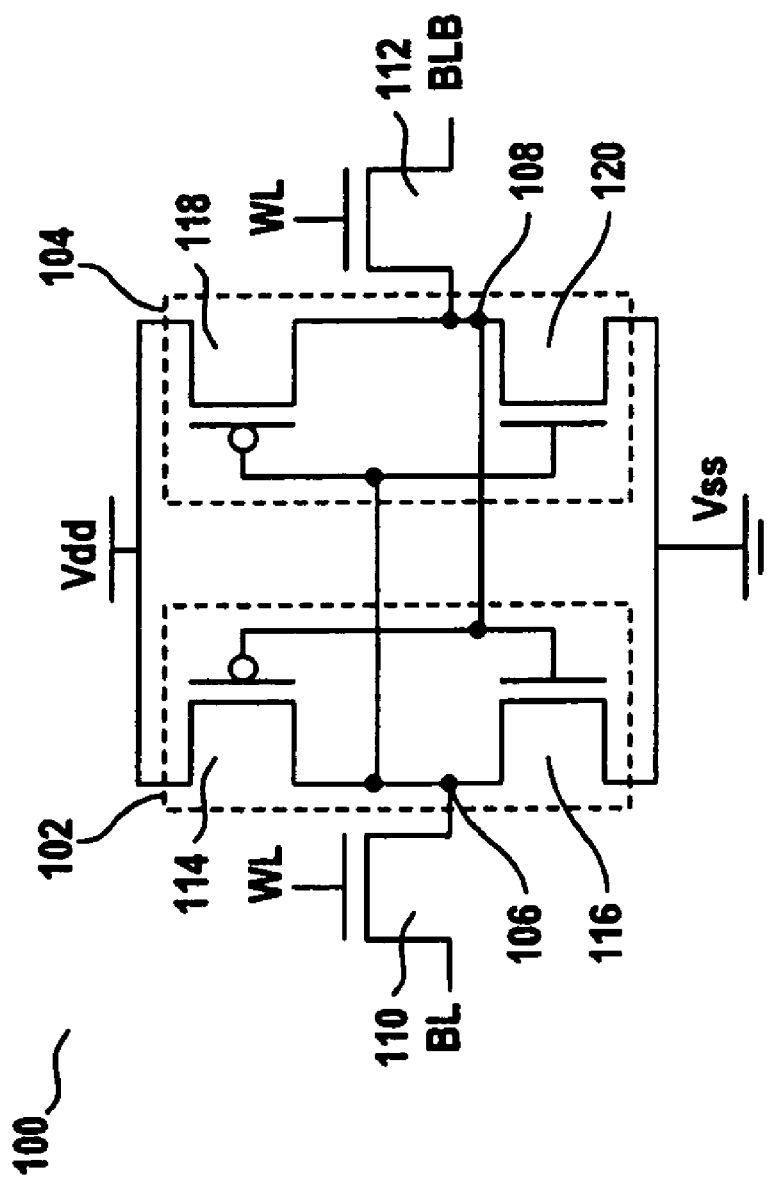
FIG. 1 is a circuit diagram of a conventional SRAM cell.

In FIG. 1, a circuit diagram 100 illustrates a standard SRAM cell having two cross-coupled inverters 102 and 104. The inverter 102 (inverter-1) includes a pull-up transistor 114 (PU-1) and a pull-down transistor 116 (PD-1). The inverter 104 (inverter-2) includes a pull-up transistor 118 (PU-2) and a pull-down transistor 120 (PD-2). A storage node 106 of the inverter 102 is connected to the gates of both transistors of the inverter 104. A storage node 108 of the inverter 104 is connected to the gates of both transistors of the inverter 102. The storage node 106 of the inverter 102 is written to and read from by controlling a transfer transistor 110 that is coupled to a bit line BL. The storage node 108 of the inverter 104 is written to and read from by controlling a transfer transistor 112 that is coupled to a bit line bar BLB. The transfer transistors 110 and 112 are controlled by a common word line WL. The SRAM cell is used to demonstrate the present invention.

Figure 2:
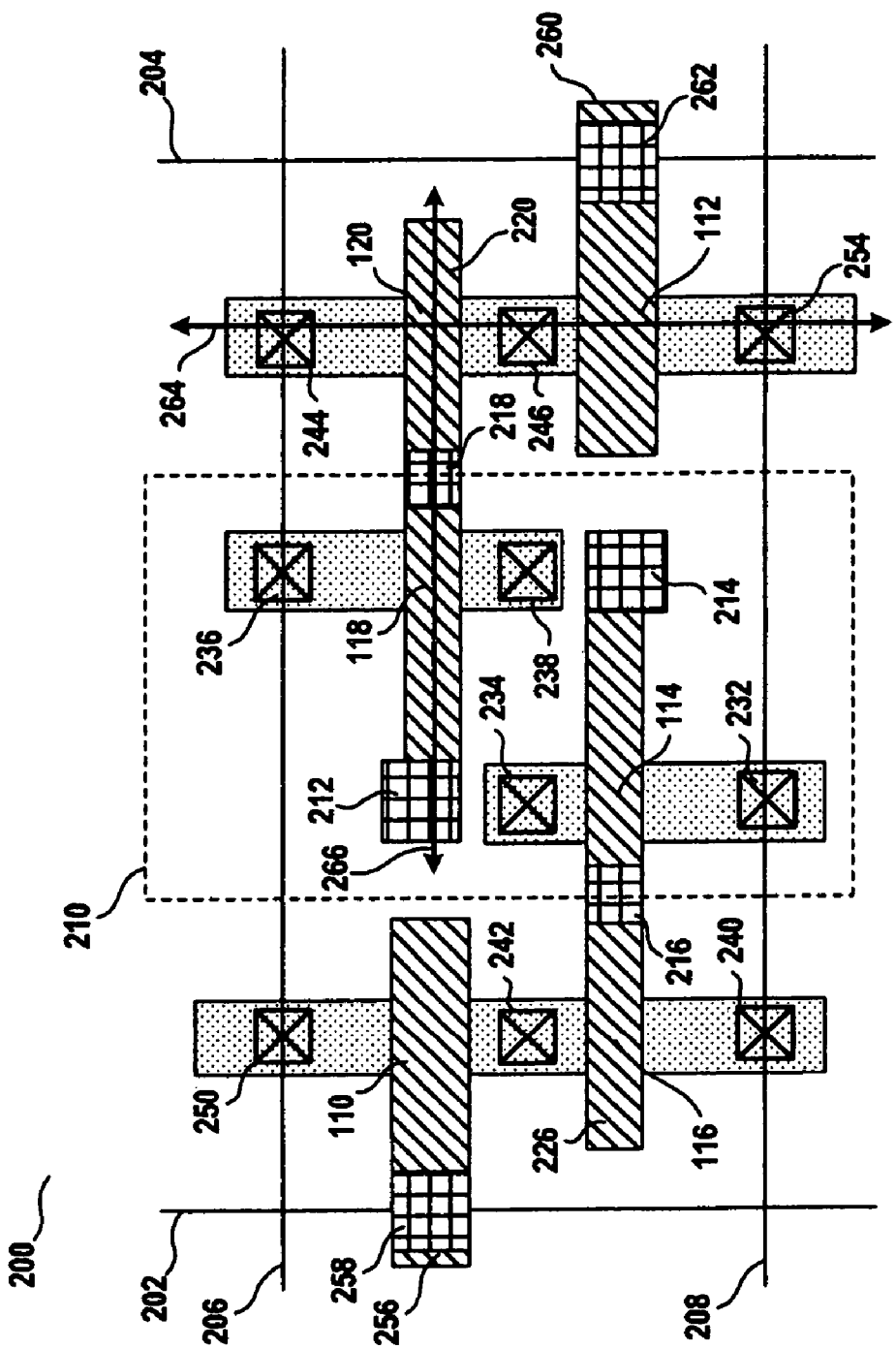
FIGS. 2 and 3 are IC layouts of the SRAM memory cell in accordance with one embodiment of the present invention.

In FIG. 2, an IC layout 200 illustrates the construction of the SRAM cell up through readiness for metal 1 deposition in accordance with one embodiment of the present invention. An SRAM cell is defined by lines 202, 204, 206, and 208. The contacts 212 and 218 are formed on a poly-silicon gate 220 that controls a pull-up transistor 118 (PU-2) and a pull-down transistor 120 (PD-2), where part of a cap layer (identified by numerals 412 and 512 in FIGS. 4 and 5) formed on the poly-silicon gate 220 has been removed. The contacts 214 and 216 are formed on a poly-silicon gate 226 that controls a pull-up transistor 114 (PU-1) and a pull-down transistor 116 (PD-1), where part of a cap layer formed on the poly-silicon gate 226 has been removed. Inside a window 210, which is a well of a second polarity type, first portions of the poly gates 220 and 226 are doped with impurities of a first polarity type. Outside the window 210, which is another well of the first polarity type, poly gates 256 and 260 and second portions of the poly gates 220 and 226 are doped with impurities of a second polarity type that is different from the first type.

Referring to FIGS. 1 and 2, the transistor 114, which is a P-channel MOS transistor (also referred to as PMOS), has a source contact 232 that is connected to a power supply voltage VCC, and a drain contact 234 that is connected to the storage node 106. The transistor 118, which is a PMOS transistor, has a source contact 236 that is connected to VCC, and a drain contact 238 that is connected to the storage node 108. The transistor 116 is an NMOS transistor that has a source contact 240 connected to a complementary power supply voltage VSS, and a drain contact 242 that is connected to the storage node 106. The transistors 114 and 116 form the inverter-1, with the common poly gate 226. The transistor 120 is an NMOS transistor that has a source contact 244 connected to VSS, and a drain contact 246 that is connected to the storage node 108. The transistors 118 and 120 form the inverter-2, with the common poly gate 220.

A pass gate transistor 110 (PG-1), which is an NMOS transistor, has a source contact 250 connected to a bit line BL (not shown in the figure), and the drain contact 242 that is common to the drain contact of the transistor 116 and connected to the storage node 106. A pass gate transistor 112 (PG-2), which is an NMOS transistor, has a source contact 254 that is connected to a bit line bar BLB (not shown in the figure), and the drain contact 246 that is common to the drain contact of the transistor 120 and connected to the storage node 108.

A poly gate 256 that controls the transistor 110 has a contact 258 that is connected to a word line WL (not shown in the figure). A cap layer is formed on the poly gate 256 outside the contact 258, which will be explained further by paragraphs below with reference to FIGS. 4 and 5. A poly gate 260 that controls the transistor 112 has a contact 262 that is connected to the word line WL (not shown in the figure). A cap layer is formed on the poly gate 260 outside the contact 262, which will also be explained further by paragraphs below with reference to FIGS. 4 and 5. A cross section line 264 runs through the transistors 120 and 112. A cross section line 266 runs through the poly gate 220. The cross-sectional views of the SRAM cell along the lines 264 and 264 will be described and explained below.

Figure 3:
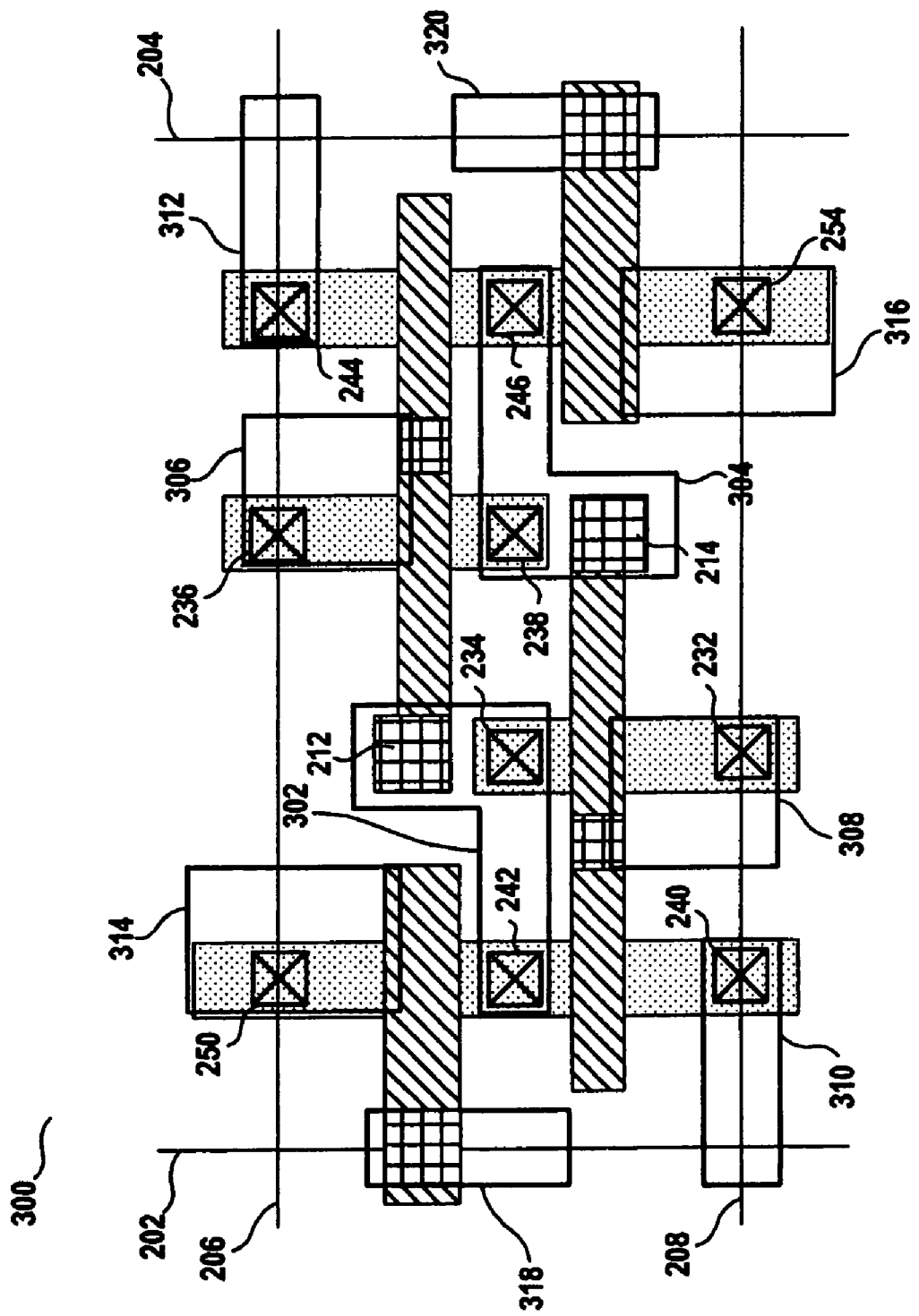

In FIG. 3, an IC layout 300 illustrates the construction of the SRAM cell up through metal 1 deposition. With reference to FIGS. 1 through 3, the SRAM cell is defined by lines 202, 204, 206, and 208. Metal 1 pads are used for intra-cell connections and landing pads. The intra-cell connections comprise an L-shaped pad 302 connecting the contact 212 to the contacts 234 and 242 to form the storage node 106, and an L-shaped pad 304 connecting the contact 214 to the contacts 238 and 246 to form the storage node 108. The landing pads comprise a pad 306 connecting to the contact 236, a pad 308 connecting to the contact 232, a pad 310 connecting to the contact 240, a pad 312 connecting to the contact 244, a pad 314 connecting to the contact 250, a pad 316 connecting to the contact 254, a pad 318 connecting to the contact 258, and a pad 320 connecting to the contact 262.

In FIG. 4, a cross section 400 illustrates self-aligned silicide contacts formed on source/drain regions of MOS transistors in accordance with one embodiment of the present invention. Metal 1 402 is connected, by vias 404 to self-aligned silicide contacts 406. A gate dielectric layer 408 is covered by a poly gate 410. A cap layer 412 is formed on the poly gate 410. Sidewall spacers 414 are formed on the sidewalls of the poly gates 410 and cap layers 412. Since the poly gates 410 are enclosed by the cap layers 412 and spacers 414, they are protected from formation of silicide thereon during the formation of the self-aligned silicide contacts 406 on source/drain regions 416. Furthermore, since the vias 404 are properly aligned, the via etch, a process required during the formation of the vias 404, causes no damage to any part of the poly gates 410.

The cap layers 412 includes a material of SiON, Ta$_2$O$_5$, A$_2$O$_3$, HfO, silicon oxide, silicon nitride, poly-ethyloxazoline (PEOX), tetra-ethylorthosilicate (TEOS), nitrogen-containing oxide, nitrided oxide, hafnium-containing oxide, tantalum-containing oxide, or aluminum-containing oxide. The cap layer 412 includes one or more sub-layers made of different materials. For example, the cap layer 412 may include a first sub-layer made substantially of silicon oxide and a second sub-layer made substantially of silicon nitride. The self-aligned silicide contacts 406 include a material of refractory metal, nitrided metal, Ti, TiSi$_2$, Co, CoSi2, Ni, NiSi, TiN, TiW, or TaN. The gate dielectric layers 408 and spacers 414 include a material of SiON, Ta$_2$O$_5$, Al$_2$O$_3$, HfO, silicon oxide, silicon nitride, poly-ethyloxazoline (PEOX), tetra-ethylorthosilicate (TEOS), nitrogen-containing oxide, nitrided oxide, hafnium-containing oxide, tantalum-containing oxide, or aluminum-containing oxide.

In FIG. 5, a cross section 500 illustrates self-aligned silicide contacts on source/drain regions of MOS transistors in accordance with one embodiment of the present invention. Metal 1 502 is connected, by vias 504 to self-aligned silicide contacts 506. A gate dielectric layer 516 is covered by a poly gate 510. A cap layer 512 is formed on the poly gate 510. Sidewall spacers 514 are formed on the sidewalls of the poly gates 510 and cap layers 512. Since the ploy gates 510 are enclosed by the cap layers 512 and the spacers 514, they are protected from formation of silicide thereon during the formation of the silicide contacts 506. Furthermore, since the vias 504 are not properly aligned, the via etch causes damage to the cap layers 512 and sidewall spacers 514. However, the etch damage is not significant. Sufficient amount of the cap layers 506 and sidewall spacers 508 protects the poly gate 510 from significant etch damage.

Figure 6:
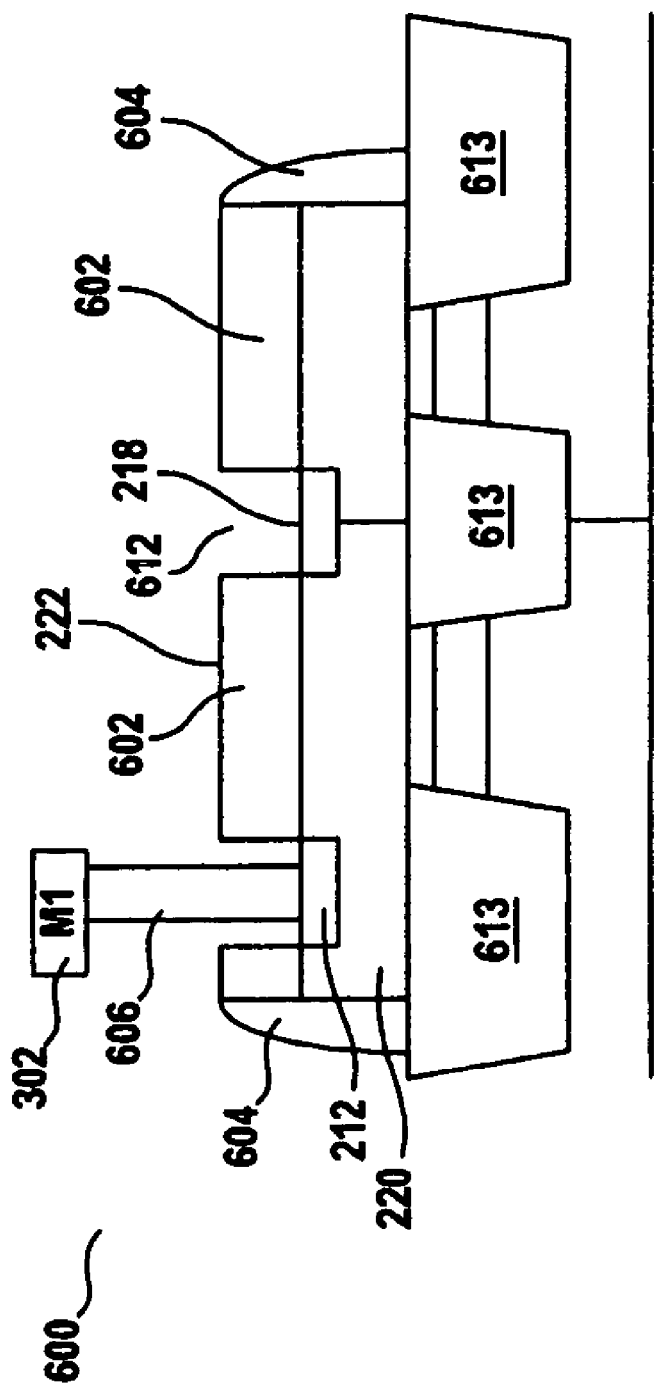

FIG. 6 illustrates a cross-sectional view 600 of the SRAM cell along the line 266 (shown in FIG. 2) in accordance with one embodiment of the present invention. With reference to FIGS. 2, 3 and 6, one or more isolation regions 613 are formed on the semiconductor substrate to define various device areas. A cap layer 602 is formed on top of the poly gates 220, while sidewall spacers 604 are formed on the edges of the poly gates 220. An electrical interconnection must be made between metal 1 pad 302, down through a via 606 and the silicide contact 212, and to the gate poly 220. The contact 212 is formed at an opening in the cap layer 602. Also, the first portion of the gate poly 220 that lies inside the window 210 must be electrically connected to the second portion that lies outside the window 210. The first and second portions are doped with different polarity types of impurities. An opening 612 is opened in the cap layer 602, thereby allowing a silicide contact 218 to form thereon. This silicide contact 218 provides the necessary electrical connection between the first and second portions of the poly gate 220. This contact 218, however, does not receive any via, and therefore does not receive any electrical contact from metal 1. The gate poly 220 is electrically continuous from the low resistance of the contact 212, through the relatively high resistance of its first portion, through the low resistance of the silicide contact 218, and through the relatively high resistance of its second portion.

This invention provides a method and structure for forming a silicide contact at the junction of two portions of the poly gate that are doped with different polarity types of impurities, thereby reducing the resistance therebetween. Furthermore, the invention provides an integrated method so that the silicide contacts at the junction and self-aligned contacts on source/drain regions can be realized in an integral semiconductor structure.

An exemplary method for forming the above proposed semiconductor structure is described as follows. A semiconductor substrate having a first device area and a second device area is provided. One or more isolation regions are formed on the semiconductor substrate for defining the first and second device areas. A silicon gate layer across the first device area and the second device area on the semiconductor substrate are formed. A first portion of the silicon gate layer running across the first device area is doped with impurities of a first type, and a second portion of the silicon gate layer running across the second device area is doped with impurities of a second type. A cap layer is formed on the silicon gate layer for protecting the same covered thereunder from forming of a silicide structure, having at least one opening at a junction of the first and second portions of the silicon gate layer. A silicide layer is formed on the silicon gate layer that is exposed by the opening for reducing resistance at the junction between the first and second portions of the gate silicon layer. A first set of source/drain doped regions are formed at two sides of the silicon gate layer in the first device area, and a second set of source/drain doped regions are formed at two sides of the silicon gate layer in the second device area. At least one self-aligned silicide contact is formed on the first and second sets of source/drain doped regions simultaneously in the step of forming the silicide layer.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure comprising:
   a semiconductor substrate having a first device area and a second device area;
   a gate layer formed across the first device area and the second device area on the semiconductor substrate, wherein a first portion of the gate layer running across the first device area is doped with impurities of a first type, and a second portion of the gate layer running across the second device area is doped with impurities of a second type;
   one or more source/drain doped regions at two sides of the gate layer;
   one or more spacers formed on sidewalls of the gate layer;
   a cap layer formed on the gate layer for protecting the same that is covered thereunder from forming a silicide structure, the cap layer having a first opening at a junction of the first and second portions of the gate layer and a second opening at another portion of the gate layer for interconnections between the gate layer and an overlying conductive layer;
   one or more vias formed on the source/drain doped regions; and
   a silicide layer formed on the source/drain doped regions and on the gate layer that is exposed by the first opening and the second opening, wherein the overlying conductive layer is connected to the silicide layer formed on the source/drain doped regions and the gate layer exposed by the second opening.

2. The semiconductor structure of claim 1 wherein the cap layer further comprises one or more sub-layers made of different materials.

3. The semiconductor structure of claim 2 wherein the cap layer further comprises a first sub-layer made substantially of silicon oxide and a second sub-layer made substantially of silicon nitride.

4. The semiconductor structure of claim 1 wherein the cap layer includes a material of SiON, $Ta_2O_5$, $Al_2O_3$, HfO, silicon oxide, silicon nitride, poly-ethyloxazoline (PEOX), tetra-ethylorthosilicate (TEOS), nitrogen-containing oxide, nitrided oxide, hafnium-containing oxide, tantalum-containing oxide, aluminum-containing oxide, or high K dielectric materials with a dielectric constant K larger than 5.

5. The semiconductor structure of claim 1 further comprising one or more isolation regions formed on the semiconductor substrate, defining the first and second device areas.

6. The semiconductor structure of claim 5 further comprising a first set of source/drain doped regions at two sides of the gate layer in the first device area and a second set of source/drain doped regions at two sides of the gate layer in the second device area.

7. The semiconductor structure of claim 6 further comprising at least one self-aligned silicide contact formed on the first and second sets of source/drain doped regions.

8. The semiconductor structure of claim 7 further comprising a gate dielectric layer formed between the gate layer and the semiconductor substrate for separating one from another.

9. The semiconductor structure of claim 8 further comprising one or more spacers formed on sidewalls of the silicon gate layer and cap layers.

10. The semiconductor structure of claim 1 wherein the silicide layer includes a material of refractory metal, nitrided metal, Ti, $TiSi_2$, Co, CoSi2, Ni, NiSi, TiN, TiW, or TaN.

11. A semiconductor structure for serving as an inverter in a static random access memory (SRAM) cell, comprising:
   a semiconductor substrate having a first device area and a second device area;
   a gate layer formed across the first device area and the second device area on the semiconductor substrate, wherein a first portion of the gate layer running across the first device area is doped with impurities of a first type, and a second portion of the gate layer running across the second device area is doped with impurities of a second type;
   a gate dielectric layer formed between the gate layer and the semiconductor substrate for separating one from another;
   a first set of source/drain doped regions at two sides of the gate layer in the first device area;
   a second set of source/drain doped regions at two sides of the gate layer in the second device area;
   one or more spacers formed on sidewalls of the gate layer;
   a cap layer formed on the gate layer for protecting the same covered thereunder from forming a silicide structure, having a first opening at a junction of the first and second portions of the gate layer and a second opening at another portion of the gate layer for interconnections between the gate layer and an overlying conductive layer;
   one or more vias formed on the first set and second set of source/drain doped regions;
   a silicide layer formed on the gate layer that is exposed by the first opening and the second opening for reducing resistance at the junction between the first and second portions of the gate silicon layer; and at least one self-aligned silicide contact formed on one of the first and second source/drain doped regions, wherein the overlying conductive layer is connected to the self-aligned silicide contact and the gate layer exposed by the second opening.

12. The semiconductor structure of claim 11 wherein the cap layer further comprises a first sub-layer made of a first material and a second sub-layer made of a second material different from the first material.

13. The semiconductor structure of claim 11 wherein the cap layer includes a material of SiON, $Ta_2O_5$, $Al_2O_3$, HfO, silicon oxide, silicon nitride, poly-ethyloxazoline (PEOX), tetra-ethylorthosilicate (TEOS), nitrogen-containing oxide, nitrided oxide, hafnium-containing oxide, tantalum-containing oxide, or aluminum-containing oxide.

14. The semiconductor structure of claim 11 wherein the silicide layer includes a material of refractory metal, nitrided metal, Ti, $TiSi_2$, Co, CoSi2, Ni, NiSi, TiN, TiW, or TaN.

* * * * *